US010100985B2

(12) United States Patent
Park et al.

(10) Patent No.: US 10,100,985 B2
(45) Date of Patent: Oct. 16, 2018

(54) ORGANIC LIGHT-EMITTING DEVICE FOR LIGHTING

(71) Applicant: Corning Precision Materials Co., Ltd., Chungcheongnam-do (KR)

(72) Inventors: Kyoung Wook Park, Chungcheongnam-do (KR); June Hyong Park, Chungcheongnam-do (KR); Hong Yoon, Chungcheongnam-do (KR); Seo Hyun Kim, Chungcheongnam-do (KR); Il Hee Baek, Chungcheongnam-do (KR); Gun Sang Yoon, Chungcheongnam-do (KR); Joo Young Lee, Chungcheongnam-do (KR); Hyun Hee Lee, Chungcheongnam-do (KR); Eun Ho Choi, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 15/101,309

(22) PCT Filed: Dec. 2, 2014

(86) PCT No.: PCT/KR2014/011670
§ 371 (c)(1),
(2) Date: Jun. 2, 2016

(87) PCT Pub. No.: WO2015/084013
PCT Pub. Date: Jun. 11, 2015

(65) Prior Publication Data
US 2016/0369956 A1 Dec. 22, 2016

(30) Foreign Application Priority Data
Dec. 2, 2013 (KR) .................. 10-2013-0148298

(51) Int. Cl.
*H01L 29/08* (2006.01)
*H04L 29/04* (2006.01)
(Continued)

(52) U.S. Cl.
CPC ............ *F21K 9/68* (2016.08); *H01L 51/0097* (2013.01); *H01L 51/5012* (2013.01);
(Continued)

(58) Field of Classification Search
CPC ............ H01L 51/5012; H01L 51/5221; H01L 51/5246; H01L 51/5268; H01L 51/5271;
(Continued)

(56) References Cited

U.S. PATENT DOCUMENTS

| 5,485,355 A * | 1/1996 | Voskoboinik ......... H05B 33/26 313/358 |
| 2002/0125822 A1 * | 9/2002 | Graff .................. H01L 51/5256 313/506 |

(Continued)

FOREIGN PATENT DOCUMENTS

| JP | 2003109747 A | 4/2003 |
| JP | 2004342522 A | 12/2004 |

(Continued)

OTHER PUBLICATIONS

International Search Report for Application No. PCT/KR2014/011670 dated Mar. 20, 2015.

*Primary Examiner* — Dzung Tran
(74) *Attorney, Agent, or Firm* — Lerner, David, Littenberg, Krumholz & Mentlik, LLP

(57) ABSTRACT

The present invention relates to an organic light-emitting device for lighting, and more specifically relates to an organic light-emitting device for lighting whereby it is possible to achieve excellent brightness by increasing the light-emitting area per unit area of an organic light-emitting (Continued)

element. For this purpose, the present invention provides an organic light-emitting device comprising: a first substrate and a second substrate disposed facing each other; a frame section which is formed between the first substrate and the second substrate, and is formed on the periphery of the first substrate and the second substrate so as to hermetically close the space between the first substrate and the second substrate; and a flexible organic light-emitting element which is disposed inside of the space, and of which at least one part has a curved surface.

8 Claims, 6 Drawing Sheets

(51) Int. Cl.
  *F21K 9/68* (2016.01)
  *H01L 51/00* (2006.01)
  *H01L 51/52* (2006.01)
  *H01L 51/50* (2006.01)
  *F21Y 115/15* (2016.01)

(52) U.S. Cl.
  CPC ...... *H01L 51/5221* (2013.01); *H01L 51/5246* (2013.01); *H01L 51/5268* (2013.01); *H01L 51/5271* (2013.01); *F21Y 2115/15* (2016.08); *H01L 51/5275* (2013.01); *H01L 2251/5338* (2013.01); *H01L 2251/5361* (2013.01); *Y02E 10/549* (2013.01)

(58) Field of Classification Search
  CPC ......... H01L 51/5275; H01L 2251/5338; H01L 2251/5361; F21K 9/68; F21Y 2115/15; Y02E 10/549
  USPC ...................................... 257/40, 59; 313/498
  See application file for complete search history.

(56) References Cited

U.S. PATENT DOCUMENTS

| 2003/0231487 | A1* | 12/2003 | Chien ................ A41D 27/085 |
| | | | 362/84 |
| 2004/0017152 | A1* | 1/2004 | Hashimoto ......... H01L 27/3246 |
| | | | 313/505 |
| 2004/0227462 | A1* | 11/2004 | Utsumi .................. H01L 51/52 |
| | | | 313/506 |
| 2007/0013291 | A1 | 1/2007 | Cok et al. |
| 2012/0025245 | A1* | 2/2012 | Nakamura ................ C03C 8/08 |
| | | | 257/98 |
| 2013/0049570 | A1 | 2/2013 | Natsume |
| 2014/0367672 | A1 | 12/2014 | Kim et al. |

FOREIGN PATENT DOCUMENTS

| JP | 2009501426 A | 1/2009 |
| JP | 2013045523 A | 3/2013 |
| KR | 20060042753 A | 5/2006 |
| KR | 20130108028 A | 10/2013 |

* cited by examiner

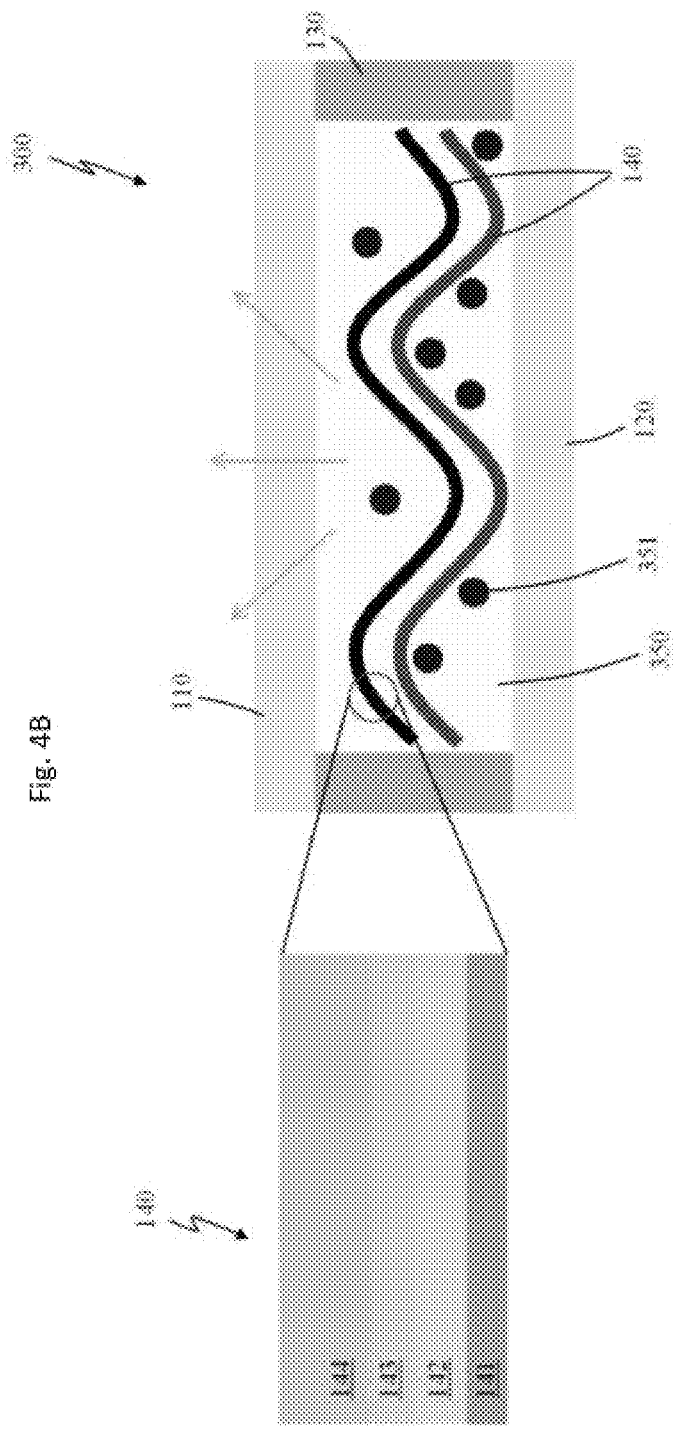

ORGANIC LIGHT-EMITTING DEVICE FOR LIGHTING

CROSS-REFERENCE TO RELATED APPLICATION

This application is a national phase entry under 35 U.S.C. § 371 of International Application No. PCT/KR2014/011670, filed Dec. 2, 2014, published in Korean, which claims priority to Korean Patent Application No. 10-2013-0148298, filed on Dec. 2, 2013, the disclosures of which are incorporated herein by reference.

TECHNICAL FIELD

The present disclosure relates to an organic light-emitting device for lighting, and more particularly, to an organic light-emitting device for lighting in which superior luminance can be realized through increasing the light-emitting area per the unit area of an organic light-emitting diode (OLED).

BACKGROUND ART

Light-emitting devices may be generally divided into organic light-emitting devices in which a light-emitting layer is formed from an organic material and inorganic light-emitting devices in which a light-emitting layer is formed from an inorganic material. Organic light-emitting diodes (OLEDs), a component of organic light-emitting devices, are self-emitting light sources based on the radiative decay of excitons in an organic light-emitting layer, the excitons being generated by the recombination of electrons injected through an electron injection electrode (cathode) and holes injected through a hole injection electrode (anode). OLEDs have a range of merits, such as low-voltage driving, self-emission, a wide viewing angle, high resolution, natural color reproducibility, and rapid response times.

Recently, research has been actively undertaken in order to apply OLEDs to a variety of devices, such as portable information devices, cameras, watches, office equipment, vehicle information display devices, televisions (TVs), display devices, illumination systems, and the like.

In order to improve the luminous efficiency of OLEDs, it is necessary to improve the luminous efficiency of a material that constitutes a light-emitting layer or to improve light extraction efficiency in terms of a level at which light generated by the light-emitting layer is extracted.

Here, light extraction efficiency depends on the refractive indices of the layers of materials that constitute an OLED. In a typical OLED, when a beam of light generated by the light-emitting layer is emitted at an angle greater than a critical angle, the beam of light may be totally reflected at the interface between a higher-refractivity layer, such as a transparent electrode layer, and a lower-refractivity layer, such as a glass substrate. This consequently lowers light extraction efficiency, thereby lowering the overall luminous efficiency of the OLED, which is problematic.

More specifically, only about 20% of light generated by an OLED is emitted outwards and about 80% of the light generated is lost due to a waveguide effect originating from the difference in refractive indices between a glass substrate and an organic light-emitting layer that includes an anode, a hole injection layer (HIL), a hole transporting layer (HTL), an emission layer (EML), an electron transporting layer (ETL), and an electron injection layer (EIL), as well as by the total internal reflection originating from the difference in refractive indices between the glass substrate and the ambient air. Here, the refractive index of the internal organic light-emitting layer ranges from 1.7 to 1.8, whereas the refractive index of indium tin oxide (ITO), generally used for the anode, is about 1.9. Since the two layers have a significantly low thickness, ranging from 200 nm to 400 nm, and the refractive index of the glass used for the glass substrate is about 1.5, a planar waveguide is thereby formed inside the OLED. It is estimated that the ratio of the light lost in the internal waveguide mode due to the above-described reason is about 45%. In addition, since the refractive index of the glass substrate is about 1.5 and the refractive index of the ambient air is 1.0, when light exits the interior of the glass substrate, a beam of the light having an angle of incidence greater than a critical angle is totally reflected and trapped inside the glass substrate. The ratio of the trapped light is commonly about 35%, and only about 20% of generated light is emitted outwards.

In order to overcome the above-described problems, several approaches for improving light extraction efficiency have been examined. For example, an antireflection film may be formed by disposing a planarization layer having an intermediate refractive index between a glass substrate and a light-emitting structure, or a barrier rib may be formed as a waveguide by dispersing white particulates or transparent particulates in transparent polymer disposed on a substrate, the refractive index of the transparent particulates being different from that of the polymer.

However, even if the above-described approaches have been introduced, the light-absorbing characteristics of materials of OLEDs limit distances that light can travel forwards. Thus, light emitted by an OLED does not have sufficient opportunity to reach the light extraction layer that is disposed on the path along which the light is emitted outwards in order to improve light extraction efficiency. In addition, in the case of the barrier rib, current may be concentrated in a portion abutting the corner thereof, since the cross-section of the barrier rib is oblong. It is highly probable that a current leakage may occur, which is problematic.

PRIOR ART DOCUMENT

Japanese Unexamined Patent Publication No. 2004-342522 (Dec. 2, 2004)

DISCLOSURE

Technical Problem

Accordingly, the present disclosure has been made keeping in consideration of the above problems occurring in the related art, and the present disclosure is intended to propose an organic light-emitting device for lighting in which superior luminance can be realized through increasing the light-emitting area per the unit area of an organic light-emitting diode (OLED).

Technical Solution

According to an aspect, an organic light-emitting device for lighting may include: first and second substrates facing each other to define a space therebetween; a frame disposed between the first and second substrates along peripheries of the first and second substrates to hermetically seal a space between the first and second substrates; and a flexible organic light-emitting element (or a flexible OLED) disposed within the space, at least one portion of the flexible organic light-emitting element having a curved surface.

Here, a reflector facing the space may be provided on areas of the first substrate, the second substrate, and the frame except for an area through which light generated by the flexible organic light-emitting element is emitted outwards.

The flexible organic light-emitting element may include: a metal electrode; an organic light-emitting layer disposed on the metal electrode; a transparent electrode disposed on the organic light-emitting layer; and a flexible base disposed on the transparent electrode.

The flexible organic light-emitting element may include: a flexible base; a first transparent electrode disposed on the flexible base; an organic light-emitting layer disposed on the first transparent electrode; and a second transparent electrode disposed on the organic light-emitting layer.

The flexible organic light-emitting element may further include a light extraction layer disposed on a front portion thereof through which light generated by the organic light-emitting layer is emitted outwards.

A filler may be disposed within the space to form a filler layer, and a plurality of light-scattering particles may be distributed in the filler layer.

A light-scattering pattern may be disposed on one of opposite surfaces of the first substrate.

A light-scattering pattern may be disposed on a surface of the second substrate facing the space.

A surface of the light-scattering pattern may have a reflective material applied thereto.

A plurality of the flexible organic light-emitting elements may be disposed within the space.

Advantageous Effects

According to the present disclosure, the flexible OLED configured such that at least one portion thereof has a curved surface is used as a light source. This can consequently increase the light-emitting area per the unit area of the OLED, thereby improving luminance.

In addition, according to the present disclosure, a reflector is disposed on an area except for an area through which light is emitted outwards. This can consequently increase luminance efficiency, thereby improving luminance.

Furthermore, according to the present disclosure, light-scattering particles are disposed in a filler layer. This can consequently increase the degree of scattering of light, thereby improving luminance.

In addition, according to the present disclosure, a transparent electrode is formed in place of an opaque metal electrode in order to realize a transparent flexible OLED. A plurality of transparent flexible OLEDs may be provided in order to further improve luminance.

Furthermore, according to the present disclosure, a light-scattering pattern may be formed on the inner and outer surfaces of the front substrate and the inner surface of the rear substrate in order to further improve luminance.

In addition, according to the present disclosure, a light extraction layer may be formed on the flexible OLED in order to improve the light extraction efficiency of the flexible OLED, thereby further improving the organic light-emitting device for lighting.

MODE FOR INVENTION

Hereinafter, reference will be made to an organic light-emitting device for lighting according to the present disclosure in detail, embodiments of which are illustrated in the accompanying drawings.

In the following description, detailed descriptions of known functions and components incorporated herein will be omitted in the case that the subject matter of the present disclosure is rendered unclear by the inclusion thereof.

Figure 1:
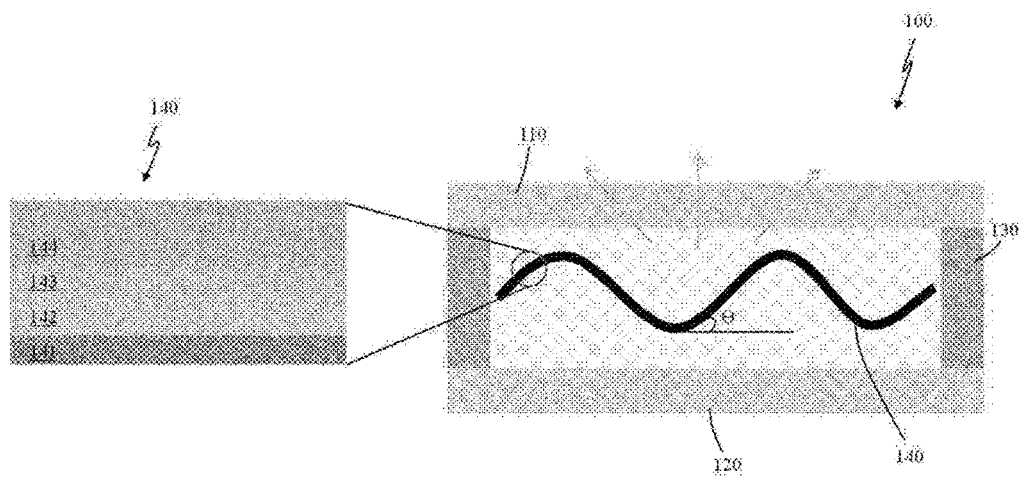
FIG. 1 is a cross-sectional view schematically illustrating an organic light-emitting device for lighting according to a first embodiment.

As illustrated in FIG. 1, an organic light-emitting device for lighting 100 according to a first embodiment includes a first substrate 110, a second substrate 120, a frame 130, and a flexible organic light-emitting diode (OLED) 140.

The first and second substrates 110 and 120 are disposed to face each other. In the first embodiment, light generated by the flexible OLED 140 is emitted outwards through the first substrate 110. In this regard, the first substrate 110 may be formed from a transparent plastic material or transparent glass. Here, the second substrate 120 may be formed from the same material as the first substrate 110.

The frame 130 is dispose between the first substrate 110 and the second substrate 120 that face each other. The frame 130 is formed along the peripheries of the first substrate 110 and the second substrate 120 to define a space between the first substrate 110 and the second substrate 120, i.e. a space in which the flexible OLED 140 is disposed, while hermetically sealing the space in order to protect the flexible OLED 140 from the external environment.

According to the first embodiment, a reflector (not shown) may be disposed on predetermined surfaces of the second substrate 120 and the frame 130 except for the first substrate 110 through which light generated by the flexible OLED 140 is emitted outwards, more particularly, surfaces of the second substrate 120 and the frame 130 facing the space, in order to improve the luminance of organic light-emitting device for lighting 100 by focusing light emitted by the flexible OLED 140 in the direction of the first substrate 110. This configuration can reflect light that would otherwise be directed sidewards or backwards in the direction of the first substrate 110. Here, the reflector (not shown) may be formed by applying a reflective material to the predetermined surfaces or may be provided as separate members attached to the predetermined surfaces.

The flexible OLED 140 is a light source of the organic light-emitting device for lighting 100, and is disposed within the sealed space defined by the first substrate 110, the second substrate 120, and the frame 130. As illustrated in the drawing, the flexible OLED 140 is configured such that at least one portion thereof has a curved surface. When the OLED 140 has a curved profile that is bent several times, the light-emitting area per the unit area thereof can be increased to be greater than that of a flat OLED. This can consequently improve the luminance of the organic light-emitting device for lighting 100.

According to the first embodiment, the flexible OLED 140 may be a laminated structure including a metal electrode 141, an organic light-emitting layer 142, a transparent electrode 143, and a flexible base 144. The metal electrode 141 is an electrode acting as the cathode of the OLED 140, and may be formed from a metal having a smaller work function in order to facilitate electron injection into the organic light-emitting layer 142. For example, the metal electrode 141 may be a metal thin film formed from Al, Al:Li, or Mg:Ag.

In addition, the transparent electrode 143 is disposed on the flexible base 144 to face away from the metal electrode 141. The transparent electrode 143 is an electrode acting as the anode of the OLED 140, and may be formed from a material having a greater work function in order to facilitate hole injection into the organic light-emitting layer 142. For example, the transparent electrode 143 may be formed from a material allowing light generated by the organic light-emitting layer 142 to easily pass through or a flexible polymer material.

The organic light-emitting layer 142 is formed between the transparent electrode 143 acting as the anode and the metal electrode 141 acting as the cathode. Although not specifically illustrated, the organic light-emitting layer 142 may include a hole injection layer (HIL), a hole transport layer (HTL), an emission layer (EML), an electron transport layer (ETL), and an electron injection layer (EIL) sequentially laminated on the transparent electrode 143. According to the structure of the organic light-emitting layer 142, when a forward voltage is applied between the transparent electrode 143 acting as the anode and the metal electrode 141 acting as the cathode, electrons migrate from the metal electrode 141 to the EML through the EIL and the ETL, and holes migrate from the transparent electrode 143 to the EML through the HIL and the HTL. Electrons and holes injected into the EML as above recombine with each other to generate excitons. When such excitons transmit from an excited state to a ground state, light is emitted. The brightness of emission light is proportional to the amount of current flowing between the transparent electrode 143 and the metal electrode 141. When the OLED 140 according to the first embodiment is a white OLED, the EML may have, for example, a laminated structure including a high-molecular EML that emits blue light and a low-molecular EML that emits orange-red light, as well as a variety of other structures, to emit white light. In addition, the organic light-emitting layer 142 may have a tandem structure. That is, a plurality of organic light-emitting layer 142 may be provided to alternate with interconnecting layers acting as charge generation layers.

Figure 2:
FIG. 2 illustrates a simulation result obtained from the organic light-emitting device for lighting according to the first embodiment using light tools.

FIG. 2 illustrates a simulation result obtained using light tools in order to measure the intensity of the organic light-emitting device for lighting according to the first embodiment. Referring to FIG. 2, it is appreciated that the intensity of light is enhanced as the unit area increases. The unit area increases with increases in the angle θ of the OLED in FIG. 1, i.e. the degree of bending of the curved surface. It is thereby appreciated that, when the flexible OLED with at least one portion thereof having a curved surface is provided as a light source, the light-emitting area per the unit area, i.e. the intensity of light, can be increased. This consequently improves the luminance of the organic light-emitting device for lighting.

In addition, according to the first embodiment, in order to improve the light extraction efficiency of the flexible OLED 140, a light extraction layer (not shown) may be formed on the front surface of the flexible base 144 that is forward of the organic light-emitting layer 142 or on the rear surface of the flexible base 144, i.e. between the flexible base 144 and the transparent electrode 143.

Hereinafter, reference will be made to an organic light-emitting device for lighting according to a second embodiment in conjunction with FIG. 3.

Figure 3:
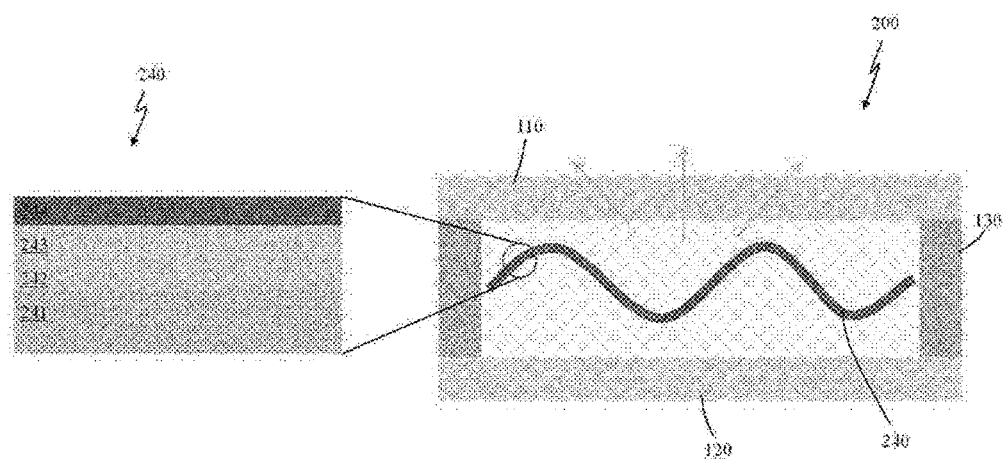
FIG. 3 is a cross-sectional view schematically illustrating an organic light-emitting device for lighting according to a second embodiment.

FIG. 3 is a cross-sectional view schematically illustrating the organic light-emitting device for lighting according to the second embodiment.

As illustrated in FIG. 3, the organic light-emitting device for lighting 200 according to the second embodiment includes a first substrate 110, a second substrate 120, a frame 130, and a flexible OLED 240.

The components of the second embodiment are substantially identical to those of the first embodiment except for the structure of the flexible OLED. The same reference numerals will be used to designate the same components, and descriptions thereof will be omitted.

The flexible OLED 240 according to the second embodiment is a transparent OLED having a double-sided light-emitting structure. In this regard, the flexible OLED 240 according to the second embodiment includes a flexible base 241 and a first transparent electrode 242, an organic light-emitting layer 243, and a second transparent electrode 244 sequentially laminated on the base 241. Here, the curved structure of the flexible OLED 240 according to the second embodiment may be configured the same as the curved structure of the flexible OLED (140 in FIG. 1) according to the first embodiment.

When the flexible OLED 240 according to the second embodiment generates light, light traveling in the direction of the second substrate 120 is reflected from a reflector (not shown) disposed on the surface of the second substrate 120 in the direction of the first substrate 110, whereby the organic light-emitting device for lighting 200 can obtain a luminance enhancement effect the same as that of the first embodiment.

Hereinafter, reference will be made to an organic light-emitting device for lighting according to a third embodiment in conjunction with FIG. 4.

Figure 4A:
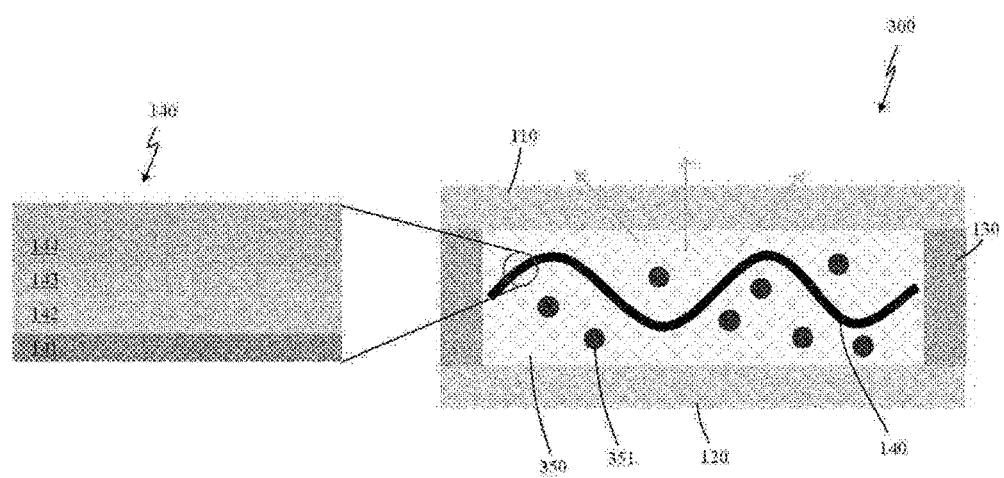
FIG. 4 is a cross-sectional view schematically illustrating an organic light-emitting device for lighting according to a third embodiment.

FIG. 4 is a cross-sectional view schematically illustrating the organic light-emitting device for lighting according to the third embodiment.

As illustrated in FIG. 4, the organic light-emitting device for lighting 300 according to the third embodiment includes a first substrate 110, a second substrate 120, a frame 130, a flexible OLED 140, and a filler layer 350.

The third embodiment is substantially identical to the first embodiment except for the filler layer being disposed in the space. The same reference numerals will be used to designate the same components, and descriptions thereof will be omitted.

The filler layer 350 is formed by filling the interior of the space defined by the first substrate 110, the second substrate 120, and the frame 130 with a resin material, such as PMA. The filler layer 350 serves to fix the flexible OLED 140, i.e. hold the flexible OLED 140 such that the flexible OLED 140 maintains the shape thereof. A plurality of light-scattering particles 351 are distributed in the filler layer 350. When the plurality of light-scattering particles 351 are distributed in the filler layer 350, light generated by the flexible OLED 140 can be scattered while passing through the filler layer 350, i.e. paths on which light travels can be diversified or complexified. This can reduce total reflection occurring at the interface between the first substrate 110 and the air, thereby further improving the luminance of the organic light-emitting device for lighting 300.

Figure 5:
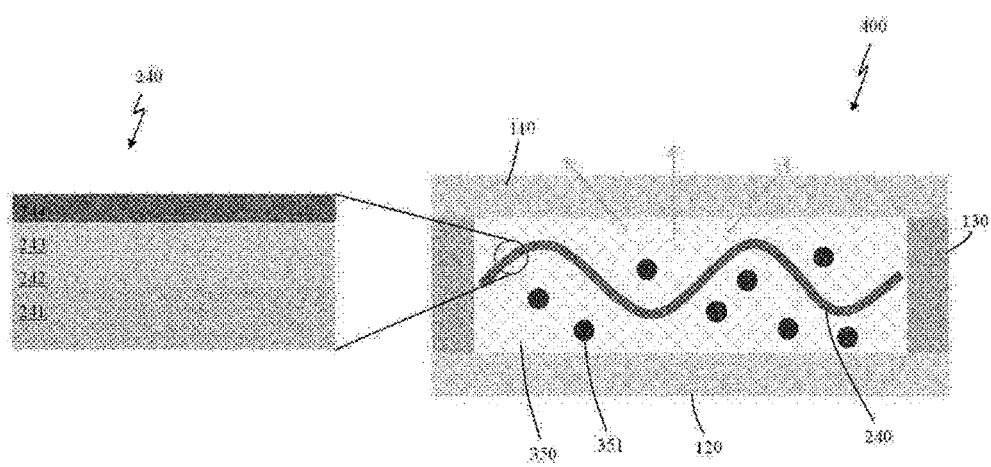
FIG. 5 is a cross-sectional view schematically illustrating an organic light-emitting device for lighting according to a fourth embodiment.

FIG. 5 illustrates an organic light-emitting device for lighting 400 according to a fourth embodiment. The organic light-emitting device for lighting 400 according to the fourth embodiment is substantially identical to the third embodiment, except that the flexible OLED 240 according to the second embodiment is used in place of the flexible OLED (140 in FIG. 1) according to the first embodiment. Thus, effects that the organic light-emitting device for lighting 400 according to the fourth embodiment can realize are the same as or similar to those of the organic light-emitting device for lighting (300 in FIG. 4) according to the third embodiment.

Hereinafter, reference will be made to an organic light-emitting device for lighting according to a fifth embodiment in conjunction with FIG. 6.

Figure 6:
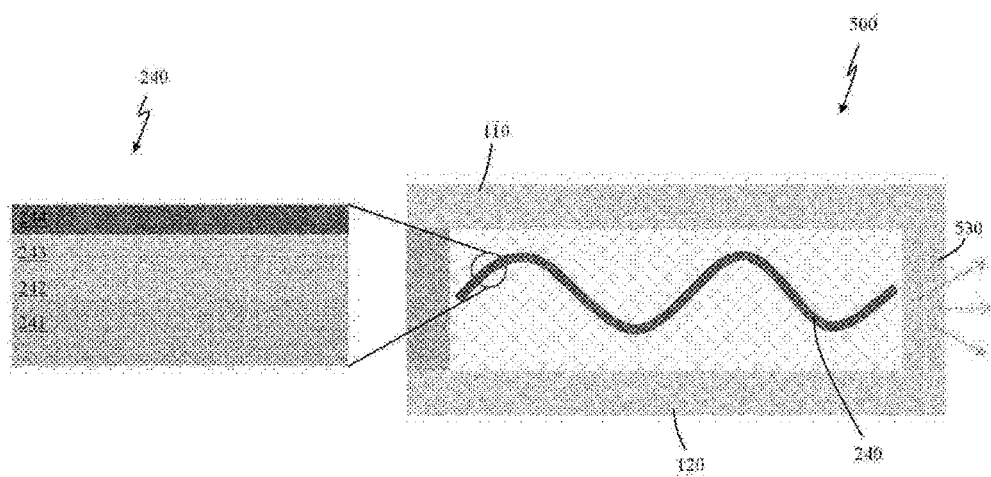
FIG. 6 is a cross-sectional view schematically illustrating an organic light-emitting device for lighting according to a fifth embodiment.

FIG. 6 is a cross-sectional view schematically illustrating the organic light-emitting device for lighting according to the fifth embodiment.

As illustrated in FIG. 6, the organic light-emitting device for lighting 500 according to the fifth embodiment includes a first substrate 110, a second substrate 120, a frame 530, and a flexible OLED 240.

The fifth embodiment is substantially identical to the second embodiment except for the frame. The same reference numerals will be used to designate the same components, and descriptions thereof will be omitted.

The organic light-emitting device for lighting 500 according to the fifth embodiment is configured such that light is emitted through a side surface, i.e. through one portion of the frame 530, instead of through the front surface, i.e. in the direction of the first substrate 110. In this regard, one of four sections of the frame 530 disposed along the peripheries of the first substrate 110 and the second substrate 120 may be formed from a transparent material. Then, reflectors (not shown) may be disposed on the surface of the first substrate 110 facing the flexible OLED 240 as well as on the surfaces of the second substrate 120 and the other three sections of the frame.

Figure 7:
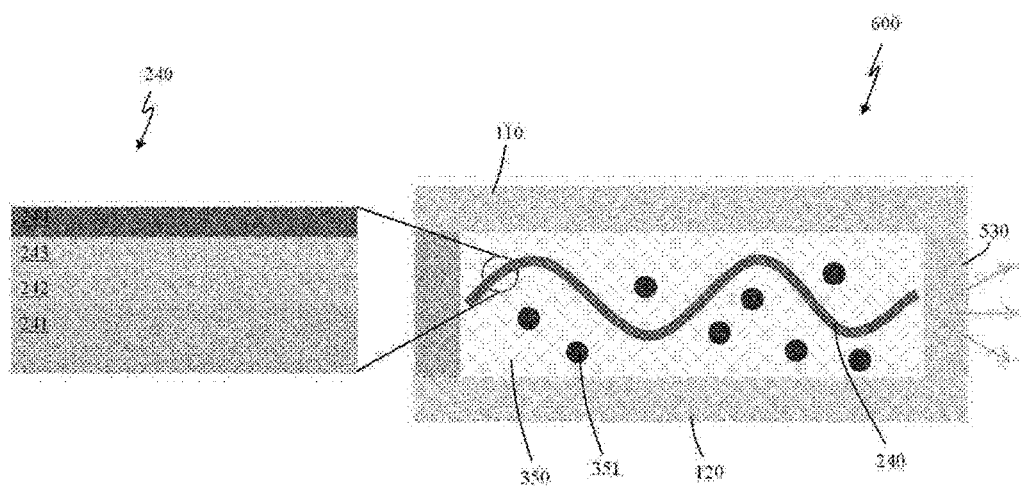
FIG. 7 is a cross-sectional view schematically illustrating an organic light-emitting device for lighting according to a sixth embodiment.

FIG. 7 illustrates an organic light-emitting device for lighting 600 according to a sixth embodiment. The organic light-emitting device for lighting 600 according to the sixth embodiment is substantially identical to the fifth embodiment, except that a filler layer 350 and light-scattering particles 351 are further included in the space. This can consequently further improve the luminance of the organic light-emitting device for lighting 600.

Hereinafter, reference will be made to an organic light-emitting device for lighting according to a seventh embodiment in conjunction with FIG. 8.

Figure 8:
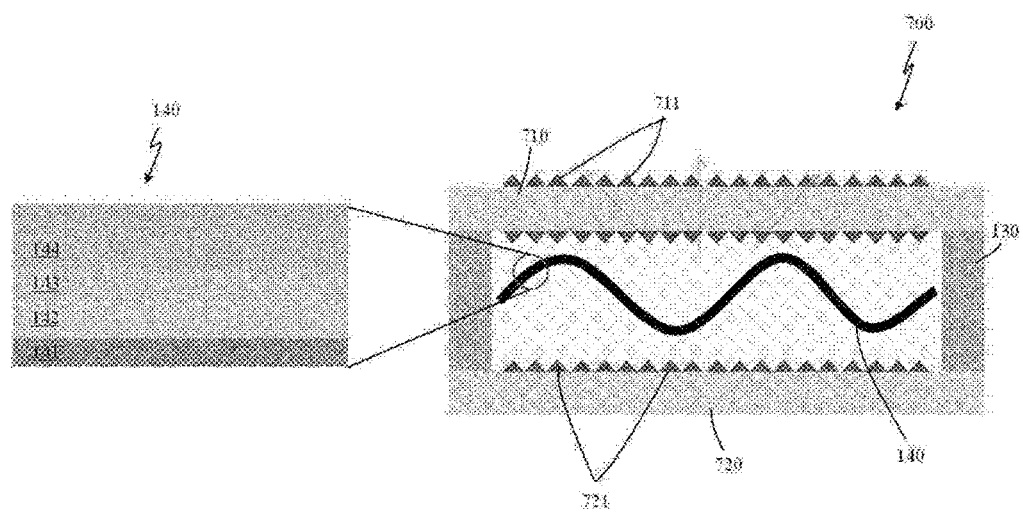
FIG. 8 is a cross-sectional view schematically illustrating an organic light-emitting device for lighting according to a seventh embodiment.

FIG. 8 is a cross-sectional view schematically illustrating the organic light-emitting device for lighting according to the seventh embodiment.

As illustrated in FIG. 8, the organic light-emitting device for lighting 700 according to the seventh embodiment includes a first substrate 710, a second substrate 720, a frame 130, and a flexible OLED 140.

The seventh embodiment is substantially identical to the first embodiment except for the structures of the first and second substrates. The same reference numerals will be used to designate the same components, and descriptions thereof will be omitted.

According to the seventh embodiment, light-scattering patterns 711 are formed on the outer surface and the inner surface of the first substrate 710, and a light-scattering pattern 721 is formed on the inner surface of the second substrate 720 facing the flexible OLED 140. The surface of the light-scattering pattern 721 formed on the inner surface of the second substrate 720 may have a reflective material applied thereto.

When the light-scattering patterns 711 and 721 are formed on the surfaces of the first substrate 710 and the second substrate 720 as described above, the same effect as obtained from the light-scattering particles (351 in FIG. 7) formed according to the third embodiment can be obtained. That is, the luminance of the organic light-emitting device for lighting 700 can be further improved.

Figure 9:
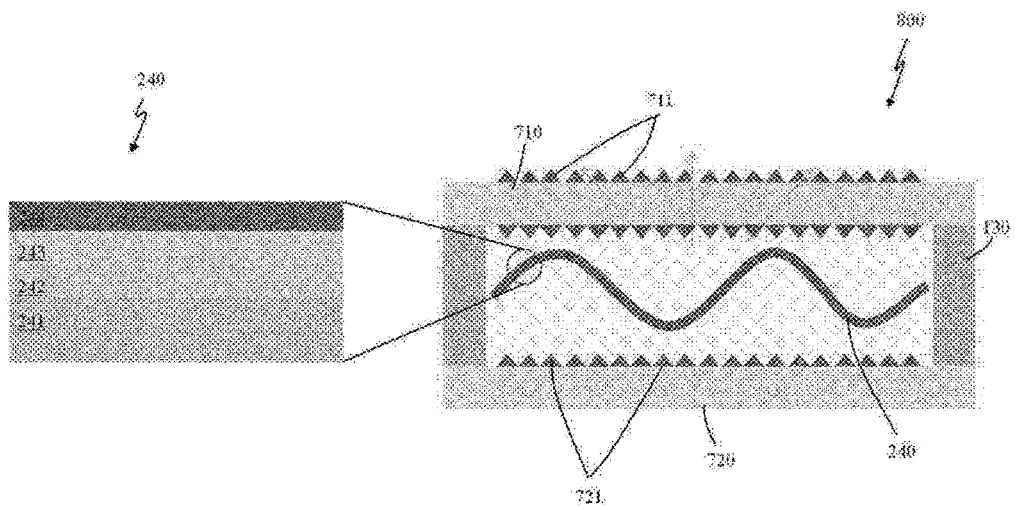
FIG. 9 is a cross-sectional view schematically illustrating an organic light-emitting device for lighting according to an eighth embodiment.

FIG. 9 illustrates an organic light-emitting device for lighting 800 according to an eighth embodiment. The organic light-emitting device for lighting 800 according to the eighth embodiment is substantially identical to the seventh embodiment, except that the flexible OLED 240 according to the second embodiment is used in place of the flexible OLED (140 in FIG. 1) according to the first embodiment. Thus, effects that the organic light-emitting device for lighting 800 according to the eighth embodiment can realize are the same as or similar to those of the organic light-emitting device for lighting (700 in FIG. 8) according to the seventh embodiment.

Figure 10:
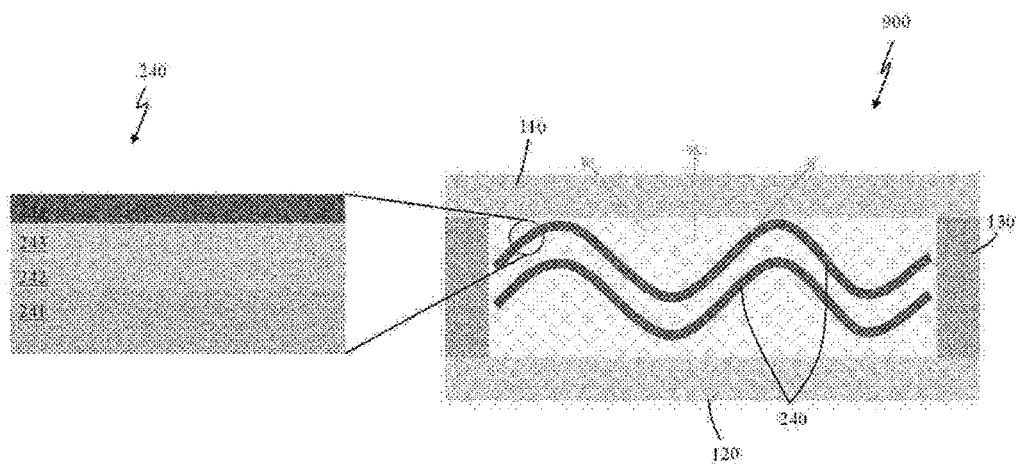
FIG. 10 is a cross-sectional view schematically illustrating an organic light-emitting device for lighting according to a ninth embodiment.

FIG. 10 illustrates an organic light-emitting device for lighting 900 according to a ninth embodiment. The organic light-emitting device for lighting 900 according to the ninth embodiment is substantially identical to the second embodiment, except that one more flexible OLED 240 is provided. Since the number of the flexible OLEDs 240 acting as a light source is doubled, the intensity of the OLED is doubled that of the second embodiment, thereby doubling the luminance of the OLED.

The foregoing descriptions of specific exemplary embodiments of the present disclosure have been presented with respect to the drawings. They are not intended to be exhaustive or to limit the present disclosure to the precise forms disclosed herein, and many modifications and variations are obviously possible for a person having ordinary skill in the art in light of the above teachings.

It is intended therefore that the scope of the present disclosure not be limited to the foregoing embodiments, but be defined by the Claims appended hereto and their equivalents.

[Description of the Reference Numerals in the Drawings]

100: organic light-emitting device for lighting
110: first substrate
120: second substrate        130: frame
140: flexible OLED           141: metal electrode

[Description of the Reference Numerals in the Drawings]

142: organic light-emitting layer
143: transparent electrode
144: flexible base

The invention claimed is:

1. An organic light-emitting device for lighting, comprising:
   first and second substrates facing each other to define a space there between, wherein a light-scattering pattern is formed on a surface of the second substrate facing the space and a reflective material is applied onto a surface of the light-scattering pattern;
   a frame disposed between the first and second substrates along peripheries of the first and second substrates to hermetically seal a space between the first and second substrates; and
   a plurality of flexible organic light-emitting elements disposed within the space, at least one portion of the flexible organic light-emitting elements having a curved surface.

2. The organic light-emitting device of claim 1, wherein a reflector facing the space is provided on areas of the first substrate, the second substrate, and the frame except for an area through which light generated by the flexible organic light-emitting element is emitted outwards.

3. The organic light-emitting device of claim 1, wherein the flexible organic light-emitting element comprises:
   a metal electrode;
   an organic light-emitting layer disposed on the metal electrode;
   a transparent electrode disposed on the organic light-emitting layer; and
   a flexible base disposed on the transparent electrode.

4. The organic light-emitting device of claim 1, wherein the flexible organic light-emitting element comprises:
   a flexible base;
   a first transparent electrode disposed on the flexible base;
   an organic light-emitting layer disposed on the first transparent electrode; and
   a second transparent electrode disposed on the organic light-emitting layer.

5. The organic light-emitting device of claim 3, wherein the flexible organic light-emitting element further comprising a light extraction layer disposed on a front portion thereof through which light generated by the organic light-emitting layer is emitted outwards.

6. The organic light-emitting device of claim 1, wherein a filler is disposed within the space to form a filler layer, and a plurality of light-scattering particles are distributed in the filler layer.

7. The organic light-emitting device of claim 1, wherein a light-scattering pattern is formed on one of opposite surfaces of the first substrate.

8. The organic light-emitting device of claim 4, wherein the flexible organic light-emitting element further comprising a light extraction layer disposed on a front portion thereof through which light generated by the organic light-emitting layer is emitted outwards.

* * * * *